United States Patent
Birkl et al.

(10) Patent No.: US 10,852,339 B2
(45) Date of Patent: Dec. 1, 2020

(54) METHOD FOR SENSING LIGHTNING-CURRENT PARAMETERS AT INSTALLATIONS HAVING ONE OR MORE CAPTURING DEVICES AND LIGHTNING-CURRENT DIVERSION PATHS

(71) Applicant: DEHN + SÖHNE GMBH + CO. KG, Neumarkt/Opf. (DE)

(72) Inventors: Josef Birkl, Berching (DE); Bernhard Eichler, Koesslarn (DE); Thomas Böhm, Hohenfels (DE); Franz Schork, Nuremberg (DE)

(73) Assignee: DEHN SE + CO KG, Neumarkt/Opf. (DE)

( * ) Notice: Subject to any disclaimer, the term of this patent is extended or adjusted under 35 U.S.C. 154(b) by 0 days.

(21) Appl. No.: 15/754,446

(22) PCT Filed: Aug. 17, 2016

(86) PCT No.: PCT/EP2016/069465
§ 371 (c)(1),
(2) Date: Feb. 22, 2018

(87) PCT Pub. No.: WO2017/036793
PCT Pub. Date: Mar. 9, 2017

(65) Prior Publication Data
US 2018/0238947 A1    Aug. 23, 2018

(30) Foreign Application Priority Data

Sep. 4, 2015 (DE) .................. 10 2015 011 739
Jan. 28, 2016 (DE) .................. 10 2016 000 930

(51) Int. Cl.
*G01R 29/08* (2006.01)
*G01R 19/00* (2006.01)
*G01R 15/18* (2006.01)
*F03D 80/30* (2016.01)
*F03D 17/00* (2016.01)

(52) U.S. Cl.
CPC ......... *G01R 29/0842* (2013.01); *F03D 17/00* (2016.05); *F03D 80/30* (2016.05); *G01R 15/181* (2013.01); *F05B 2260/83* (2013.01); *G01R 19/0092* (2013.01); *Y02B 10/30* (2013.01); *Y02E 10/72* (2013.01)

(58) Field of Classification Search
None
See application file for complete search history.

(56) References Cited

U.S. PATENT DOCUMENTS

| | | | | |
|---|---|---|---|---|
| 2007/0108770 A1* | 5/2007 | Riesberg | ................... | F03G 7/08 290/44 |
| 2010/0280797 A1* | 11/2010 | Erichsen | ................ | H02G 13/00 702/189 |
| 2012/0133143 A1 | 5/2012 | Kimura et al. | ................. | 290/55 |
| 2012/0133146 A1 | 5/2012 | Naka et al. | ...................... | 290/55 |
| 2013/0028739 A1* | 1/2013 | Erichsen | ................. | F03D 80/30 416/146 R |

(Continued)

FOREIGN PATENT DOCUMENTS

| DE | 102013002927 A1 | 8/2014 | ............... F03D 7/00 |
|---|---|---|---|
| EP | 1754877 A1 | 2/2007 | ............... F02G 1/02 |

(Continued)

OTHER PUBLICATIONS

A. Asakawa, et al.: "Direct Lightning Hits on Wind Turbines in Winter Season Lightning Observation Results for Wind Turbines at Nikaho Wind Park in Winter", IEEJ Transactions on Electrical and Electronic Engineering, vol. 5, No. 1, Jan. 1, 2010 (Jan. 1, 2010), pp. 14-20, XP055025133, ISSN: 1931-4973, DOI: 10.1002/tee.20487 the whole document.

The Notification Concerning Transmittal of Copy of International Preliminary Report on Patentability (Chapter I of the Patent Cooperation Treaty), in English, dated Mar. 15, 2018, which was issued by the International Bureau of WIPO in Applicant's corresponding international PCT application having Serial No. PCT/EP2016/069465, filed on Aug. 17, 2016.

English translation of the International Preliminary Report on Patentability (Chapter I of the Patent Cooperation Treaty), dated Mar. 6, 2018, which was issued by the International Bureau of WIPO in Applicant's corresponding international PCT application having Serial No. PCT/EP2016/069465, filed on Aug. 17, 2016.

(Continued)

*Primary Examiner* — Jermele M Hollington
*Assistant Examiner* — Suresh K Rajaputra
(74) *Attorney, Agent, or Firm* — Bodner & O'Rourke, LLP; Gerald T. Bodner; Christian P. Bodner

(57) ABSTRACT

The invention relates to a method for sensing lightning-current parameters at installations comprising a plurality of capturing devices and lightning-current diversion paths, in particular for exposed and/or tall buildings, including wind turbines, by using a plurality of sensors on the lightning-current diversion paths to identify a lightning-current event, and comprising subsequent evaluation of the lightning-current event and the effect of the lightning-current event on the particular installation. According to the invention, a lightning-current detection sensor is formed on each of the capturing devices or each lightning-current diversion path, which lightning-current detection sensor provides a yes/no statement concerning a lightning-current event with respect to the particular capturing device or the particular lightning-current diversion path. Furthermore, at least one lightning-current measurement sensor is provided at a central point of the merging of the lightning-current diversion paths toward the ground, which at least one lightning-current measurement sensor detects both surge currents having a duration of less than 5 ms and long-term currents having a duration of more than 5 ms, wherein furthermore the magnitude of the charge of the particular long-term current that has occurred is determined and is used to determine possible effects on the installation.

7 Claims, No Drawings

(56) References Cited

U.S. PATENT DOCUMENTS

| | | | | |
|---|---|---|---|---|
| 2013/0099772 A1* | 4/2013 | Van Deventer | ........ | B64D 45/02 |
| | | | | 324/72 |
| 2014/0093373 A1 | 4/2014 | Schmidt et al. | ................ | 416/61 |
| 2015/0050143 A1* | 2/2015 | Kammer | ................ | F03D 17/00 |
| | | | | 416/1 |
| 2016/0041205 A1* | 2/2016 | Aoi | .................... | G01R 29/0842 |
| | | | | 324/72 |

FOREIGN PATENT DOCUMENTS

| | | | | |
|---|---|---|---|---|
| EP | 1631846 B1 | 8/2008 | .............. | F03D 1/00 |
| EP | 2270524 A1 | 1/2011 | ............. | G01R 29/08 |
| EP | 2385246 A1 | 11/2011 | .............. | F03D 1/00 |
| EP | 2395320 A1 | 12/2011 | .............. | F03D 11/00 |
| EP | 2980593 A1 | 2/2016 | ............. | G01R 15/24 |
| WO | WO2009083006 A1 | 7/2009 | ............. | H02G 13/00 |
| WO | WO2014157110 A1 | 10/2014 | ............ | G01R 15/24 |

OTHER PUBLICATIONS

Written Opinion of the International Searching Authority, in English (Mar. 6, 2018—mailed with the English translation of the International Preliminary Report on Patentability), which was issued by the International Bureau of WIPO in Applicant's corresponding international PCT application having Serial No. PCT/EP2016/069465, filed on Aug. 17, 2016.

International Search Report, in English, dated Nov. 8, 2016, which was issued by the International Bureau of WIPO in Applicant's corresponding international PCT application having Serial No. PCT/EP2016/069465, filed on Aug. 17, 2016.

\* cited by examiner

METHOD FOR SENSING LIGHTNING-CURRENT PARAMETERS AT INSTALLATIONS HAVING ONE OR MORE CAPTURING DEVICES AND LIGHTNING-CURRENT DIVERSION PATHS

The invention relates to a method for sensing lightning-current parameters at installations comprising one or more capturing devices and lightning-current diversion paths, in particular for exposed and/or tall buildings, including wind turbines, by using a plurality of sensors on the lightning-current diversion paths to identify a lightning-current event, and comprising subsequent evaluation of the lightning-current event and the effect of the lightning-current event on the particular installation according to claim 1.

If lightning strikes a building or a technical installation, high lightning currents will be caused to flow. Lightning currents are so-called impressed currents. Lightning current therefore represents a primary danger taken into account by all of the protective measures according to Lightning Protection Standard DIN EN 62305.

Lightning protection components, through which the entire lightning current or partial lightning currents flow(s) depending on the power distribution in an overall plant, must resist the thermal and mechanical effects of the lightning current. It is known to use lightning-current measuring units to detect lightning strikes and thus lightning currents. Such measuring units also serve to identify the lightning-current parameters of the entire lightning current or the partial lightning currents in order to analyze the same so that the load of particular installation parts can be identified. The respective determined data will then allow maintenance works to be executed in the installations.

A method for detecting lightning strikes on wind turbines is already known from US 2014/0093373 A1, wherein a current sensor is situated in the common ground connector and detects whether and to what extent the receptors in the rotor blades were exposed to an influence of lightning current.

EP 2 385 246 A1 shows a further arrangement for detecting lightning strikes in wind turbines, with an ozone sensor being provided in the area of the turbine of the wind power plant. A spark discharge is generated in case of a lightning strike which in turn releases a certain amount of ozone which can then be detected.

According to EP 1 631 846 B1 it is known to guide a lightning current of a rotor blade completely or in part through at least one electrical resistor and to determine the heating of the resistor so as to enable a qualitative current evaluation from this.

An arrangement of a plurality of sensors on rotor blades with subsequent data analysis and evaluation is described in EP 2 270 524 A1 or in US 2012/0133146 A1.

According to the teaching pursuant to US 2012/0133143 A1 it is known to dispose sensors in each rotor blade of a wind turbine with the object of evaluating possible damages in addition to positionally localizing the respective damage in the rotor blade. As a supplement, a Rogowski coil is present there in the area of the base of the wind turbine to determine an entire load upon lightning strikes.

The generic document EP 1 754 887 A1 art discloses field sensors arranged to be distributed across a rotor blade of a wind turbine in order to record lightning strikes. The data from theses sensors are combined in an evaluating unit. Furthermore, a central entity is present serving the purpose of lighting current determination.

All of the above solutions have in common to be capable of identifying a lightning current event as such. On the other hand, the already known detection of lightning current events are related to identifying surge currents, i.e. short-term pulses of high energy.

By standards, it is defined for lightning capturing devices, in particular in wind turbines, to be mounted on the upper surface of the rotor blade where lightning channel connections are generated and lightning strikes or disruptive discharges may be caused without capturing device. In this case, the manufacturer should ensure that the capturing devices are fixed in the corresponding supports. Capturing devices have to be designed such as to withstand the expected wear through wind, humidity and particles. Due to erosions at the base points of electric arcs, capturing devices will wear over time. Thus, the erosion depends on the frequency and strength of lightning current events so that identifying the frequency of lightning current events makes sense for the purpose of optimized maintenance.

Erosion, however, also depends on the charge which occurs in case of electric arcs caused by lightning current. Consequently, it is provided by standards that the respective manufacturers define methods for a regular inspection of the capturing devices so that the estimated design value of lifetime and the maintenance and exchange intervals can be fixed and verified.

It became apparent that not only the short-term discharge parameters in lightning current events are relevant for the lifetime of corresponding plants and facilities, rather it has to be determined whether and to what extent long-term currents having a duration of more than 2 ms occur in the case of a lightning current.

Long-term currents having high charge values may result in a strong heating and even fused areas in capturing devices at the base point of the electric arc of the lightning. In particular in case of wind turbines, such phenomena may lead to great problems such as fused areas on receptors of rotor blades.

From the aforementioned, it is therefore a task of the invention to propose a further developed method for sensing lightning-current parameters at installations comprising a plurality of capturing devices and lightning-current diversion paths, in particular wind turbines, which method is capable to render an improved and more precise statement as to the state of the plant and with respect to maintenance intervals.

The solution of the task of the invention is performed pursuant to the teaching according to claim 1, with the dependent claims comprising at least appropriate designs and further developments.

According to the invention, in addition to detecting short-term pulses and current peak values, an identification of the charge caused by long-term currents is performed along with determining the specific energy in this respect over the complete long-term current flow duration so that damages due to high charge values are reliably assessable. By way of the inventive measures, charge values and W/R of short-term and long-term components of a lightning stroke are thus identified. This makes it possible to also consider that case in the evaluation in which only a long-term current having low superimposed pulses occurs which cannot be recorded in known measuring devices.

The teaching according to the invention moreover enables long-term currents without superimposed pulse currents to be detected and evaluated. Such long-term currents represent about 50% of the lightning discharges at installations having a tall operating height.

Detecting long-term currents is in particular of great importance at high buildings or exposed buildings or installations as is the case in particular in wind energy plants. The implementation of the inventive method creates a solution satisfying all of the requirements of relevant standards in terms of operation and lightning protection in wind turbines.

In the method for sensing lightning-current parameters at installations comprising a plurality of capturing devices and lightning-current diversion paths, in particular for exposed and/or tall buildings such as wind turbines, according to the invention, a lightning-current detection sensor is arranged at each of the capturing devices or at each lightning-current diversion path, which lightning-current detection sensor exclusively provides a yes/no statement concerning a lightning-current event in relation to the respective capturing device of the respective lightning-current diversion path. These lightning-current detection sensors may be of a very simple configuration. They only serve to detect at which capturing device or in which lightning-current diversion path a strike has actually occurred. The lightning-current detection sensors are configured according to the invention so as to supply data to a central evaluating unit without any additional measuring line, and in fact especially give notice of a lightning current having flown in the diversion path concerned.

At least one lightning-current measurement sensor is provided at a central point of the merging of the lightning-current diversion paths toward the ground, which lightning-current measurement sensor detects both surge currents having a duration of less than 5 ms and long-term currents having a duration of more than 5 ms, wherein furthermore the magnitude of the charge of the particular long-term current that has occurred is determined and used to determine possible effects on the installation.

Accordingly, it is only necessary to form a high-grade lightning-current measurement sensor at a central point of the merging of the lightning-current diversion paths which is capable of determining the relevant lightning-current parameters at high accuracy.

Due to the wireless connection of the lightning-current detection sensors to the central unit, problems otherwise given in wired data transmission, in particular with respect to the necessary separating distance, will not be generated.

Since the lightning-current detection sensors only provide and are required to forward the mentioned yes/no statement with respect to a lightning current and a measuring in the classical sense is not performed, the sensors may be constructed in a simple manner and may be realized at low cost. Moreover, such sensors have a very low energy consumption so that expensive external power supply devices may be omitted. The necessary energy for the lightning-current detection sensor may be obtained, for instance, from the electromagnetic field of the actual lightning current. There is likewise the option in lightning-current detection sensors provided in movable lightning conductors, e.g. rotor blades of wind turbines, to obtain the necessary energy from the kinetic energy of the rotor blades, e.g. while utilizing piezo elements.

In a further development of the invention, when possible effects of lightning currents are determined, the obtained lightning-current parameters are allocated to the respective lightning-current diversion path, wherein the spatial allocation of the lightning-current detection sensors to the corresponding parts of the installation is referred to for this purpose. In this respect, the respective lightning-current detection sensor, when forwarding a yes statement related to a lightning-current event, will also transmit an address indicating the spatial allocation of the respective lightning-current sensor.

The charge values due to the lightning current are used to analyze the expected lifetime of mechanical, energized components of the installation, wherein a tabular assignment of empirical values from long-term studies may be referred to in this respect.

In a design of the invention, the at least one lightning-current measurement sensor comprises two Rogowski coils. A first Rogowski coil detects single pulses of a high current level with up to 200 kA and a short pulse duration of up to 5 ms.

A second Rogowski coil is used for long-term current detection of lower currents at a pulse duration of up to 1 s.

The method according to the invention is in particular intended for being used in wind turbines, wherein the lightning-current detection sensors are provided at the respective connection point between the respective wind power rotor blade and the hub, and the at least one lightning-current sensor is provided at or in proximity of the rotor shaft, preferentially in the area of the transition of the hub to the nacelle.

Preferably, in this inventive use as well, the signal transmission for the yes/no decision is performed in a wireless manner between the lightning-current detection sensors and an evaluating unit.

The electrical operating power required for operating the lightning-current detection sensors is obtained, in a further development according to the invention, from the kinetic energy of the rotor blades.

The invention will be explained below in more detail on the basis of an exemplary embodiment of the preferred use in wind turbines.

Due to the higher requirements that wind turbines have to meet with respect to performance and the involved investment costs, assurances and wind farm operators demand a reliable measuring system for identifying lightning currents. This not only applies to new installations but also to retrofits of already existing wind turbines.

The standard DIN EN 61400-24, wind turbines—part 24: lightning protection, regulates among other things how the lightning-current discharging system and the connecting components thereof must be realized. Connections to the discharging system must be fixed and permanent and ensure that the overall system is able to withstand the combined effect of electrical, thermal and electrodynamic influences of the lightning current.

Proofs must be presented that the lightning protection system is able to withstand the mechanical load in the rotor blades. All of the connecting components need to be certified. Internal parts of the discharging system and the connecting components must be realized such that the risk of internal discharges which might originate from these parts, is kept as low as possible. Externally mounted discharging means are defined as capturing devices. The manufacturers of such devices and installations are required to fix a method for a regular inspection of all of the parts of the discharging system and its connecting parts which wear out due to environmental conditions, so that the conditions and the estimated design value of the lifetime and the maintenance intervals of the corresponding parts are verifiable.

Due to the height and exposed position of the rotor blades of wind turbines, the entire rotor blade construction is often subjected to strong electrical fields during its operating lifetime. Thunderclouds generate strong static and transient electrical fields which act upon the rotor blade construction by electricity and deteriorate the insulating properties of composite materials over time.

The inventive method in its preferred application in wind turbines serves to detect all relevant lightning-current parameters, and this both of short-term pulses and long-term components and the charge values thereof, so that a very reliable assessment of damages can be performed and maintenance intervals fixed in a reasonable manner.

When wireless lightning-current detection sensors are used, the advantage as compared to wired lightning-current sensors is that the measuring signal can be transmitted over rotating components. The central data acquisition with respect to the yes/no values delivered by the lightning-current detection sensors is performed by means of a unit which is expediently accommodated in the nacelle of the wind turbine. The hub or shaft leading to the actual electrodynamic generator via a gear, forms the central point of the merging of the lightning-current diversion paths toward the ground. There, a lightning-current measurement sensor will be provided which is composed, for instance, of two specifically modified Rogowski coils. The Rogowski coils are designed such that single pulses are detected from the current level, on the one hand, and yet a long-term current detection of lower currents of up to a pulse duration of 1 s can be realized, on the other.

The data obtained and collected in the evaluating unit of the respective wind turbine can be checked for relevance and transmitted to the plant operator in terms of an alarm function upon detecting abnormal disturbance variables. In order to guarantee an alarm data transmission even when the entire wind turbine is failing, a UMTS or GSM telecommunication connection backed by emergency power may be referred to.

The invention claimed is:

1. Method for sensing lightning-current parameters at installations comprising a plurality of capturing devices and lightning-current diversion paths, in particular for exposed and/or tall buildings, including wind turbines, by using a plurality of sensors on the lightning-current diversion paths to identify a lightning-current event, and comprising subsequent evaluation of the lightning-current event and the effect of the lightning-current event on the particular installation, characterized in that a lightning-current detection sensor is arranged at each of the capturing devices or at each lightning-current diversion path, which lightning-current detection sensor provides a yes/no statement concerning a lightning-current event in relation to the respective capturing device of the respective lightning-current diversion path, wherein at least one lightning-current measurement sensor is provided at a central point of the merging of the lightning-current diversion paths toward the ground, which lightning-current measurement sensor detects both surge currents having a duration of less than 5 ms and long-term currents having a duration of more than 5 ms, wherein furthermore the magnitude of the charge of the particular long-term current that has occurred is determined and used to determine possible effects on the installation, wherein the installation is a wind turbine having rotor blades, a rotor shaft and a hub, and wherein the at least one lightning-current measurement sensor is provided at the rotor shaft.

2. Method according to claim 1, characterized in that when possible effects of lightning currents are determined, the obtained lightning-current parameters are allocated to the respective lightning-current diversion path, and the spatial allocation of the lightning-current detection sensors to the parts of the installation is referred to for this purpose.

3. Method according to claim 1, characterized in that the obtained charge values due to the lightning current are used to analyze the expected lifetime of in particular mechanical, energized components of the installation.

4. Method according to claim 1, characterized in that the at least one lightning-current measurement sensor comprises two Rogowski coils, wherein a first Rogowski coil detects single pulses of a high current level with up to about 200 kA and a short pulse duration of up to 5 ms, and a further Rogowski coil detects long-term current of lower currents at a pulse duration of up to 1 s.

5. Method according to claim 1, characterized by the lightning-current detection sensors are provided at a respective connection point between at least one rotor blade of the rotor blades and the hub.

6. Method according to claim 5, characterized in that the signal transmission for the yes/no decision is performed in a wireless manner between the lightning-current detection sensors and an evaluating unit.

7. Method according to claim 6, characterized in that the electrical operating power required for operating the lightning-current detection sensors is obtained from the kinetic energy of the rotor blades.

* * * * *